(12) United States Patent
Mattes et al.

(10) Patent No.: US 7,653,170 B2
(45) Date of Patent: Jan. 26, 2010

(54) ELECTRICAL CIRCUIT FOR MEASURING TIMES AND METHOD FOR MEASURING TIMES

(75) Inventors: Heinz Mattes, München (DE); Thomas Piorek, Taufkirchen (DE); Sebastian Sattler, München (DE); Olaf Stroeble, Planegg (DE)

(73) Assignee: Infineon Technologies AG, Neubiberg (DE)

( * ) Notice: Subject to any disclaimer, the term of this patent is extended or adjusted under 35 U.S.C. 154(b) by 246 days.

(21) Appl. No.: 11/440,481

(22) Filed: May 25, 2006

(65) Prior Publication Data

US 2006/0274607 A1 Dec. 7, 2006

(30) Foreign Application Priority Data

May 25, 2005 (DE) .................. 10 2005 024 648

(51) Int. Cl.
*G04F 10/04* (2006.01)
(52) U.S. Cl. .......................................... 377/20; 377/19
(58) Field of Classification Search ........................ None
See application file for complete search history.

(56) References Cited

U.S. PATENT DOCUMENTS

| 4,468,746 A * | 8/1984 | Davis ........................... 702/178 |
| 4,875,201 A | 10/1989 | Dalzell |
| 5,128,624 A | 7/1992 | Hoshimo et al. |
| 5,204,678 A | 4/1993 | Foley |
| 5,528,200 A | 6/1996 | Yamauchi et al. |
| 5,689,539 A | 11/1997 | Murakami |
| 5,812,626 A | 9/1998 | Kusumoto et al. |
| 5,828,717 A | 10/1998 | Kusumoto et al. |
| 5,999,586 A * | 12/1999 | Terada et al. .................... 377/20 |
| 6,172,557 B1 * | 1/2001 | Terada et al. .................. 329/341 |
| 6,642,801 B1 * | 11/2003 | Zortea et al. .................... 331/57 |
| 6,661,266 B1 | 12/2003 | Variyam et al. |
| 6,841,985 B1 | 1/2005 | Fetzer |
| 2003/0107951 A1 | 6/2003 | Sartschev et al. |
| 2004/0061488 A1 | 4/2004 | Rosenbaum et al. |

FOREIGN PATENT DOCUMENTS

| DE | 10139061 | 2/2002 |
| EP | 0735374 A2 | 10/1996 |
| EP | 0749210 A2 | 12/1996 |

* cited by examiner

*Primary Examiner*—Cassandra Cox
(74) *Attorney, Agent, or Firm*—Dicke, Billig & Czaja, PLLC

(57) ABSTRACT

An electrical circuit used for measuring times is disclosed. In one embodiment, the electrical circuit has a counter, a decoder and a multiplicity of time trap elements. At least the counter and the time trap elements are located together on an integrated semiconductor component. Each time trap element has a data input, a clock input, a delay output and a output port. The time trap element contains a delay element and a flip flop. The delay element outputs a signal change at the data input with a time delay at the delay output. The flip flop has a data input, a clock input and an output port, the data inputs, the clock inputs and the output ports of the flip flop and of the time trap element being connected to one another. The time trap elements are connected as ring oscillator.

29 Claims, 9 Drawing Sheets

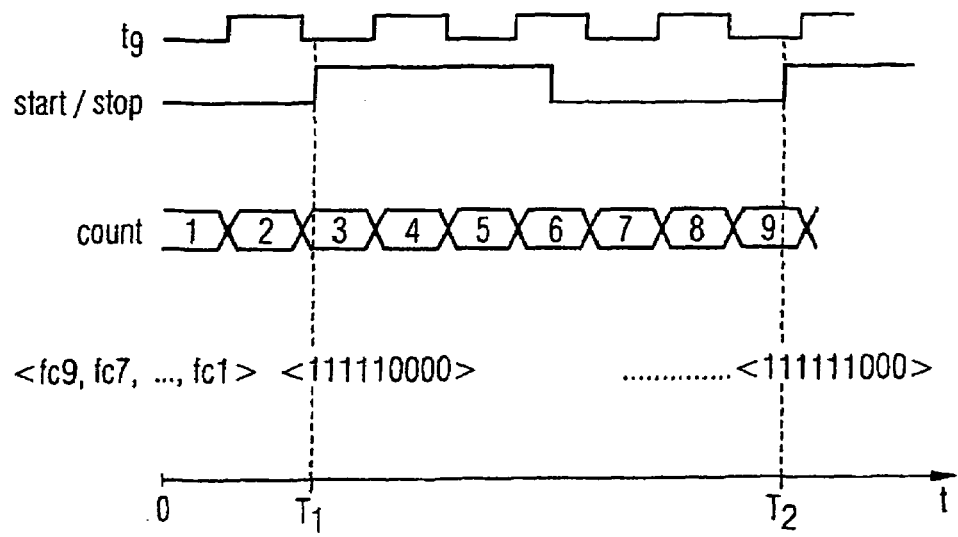
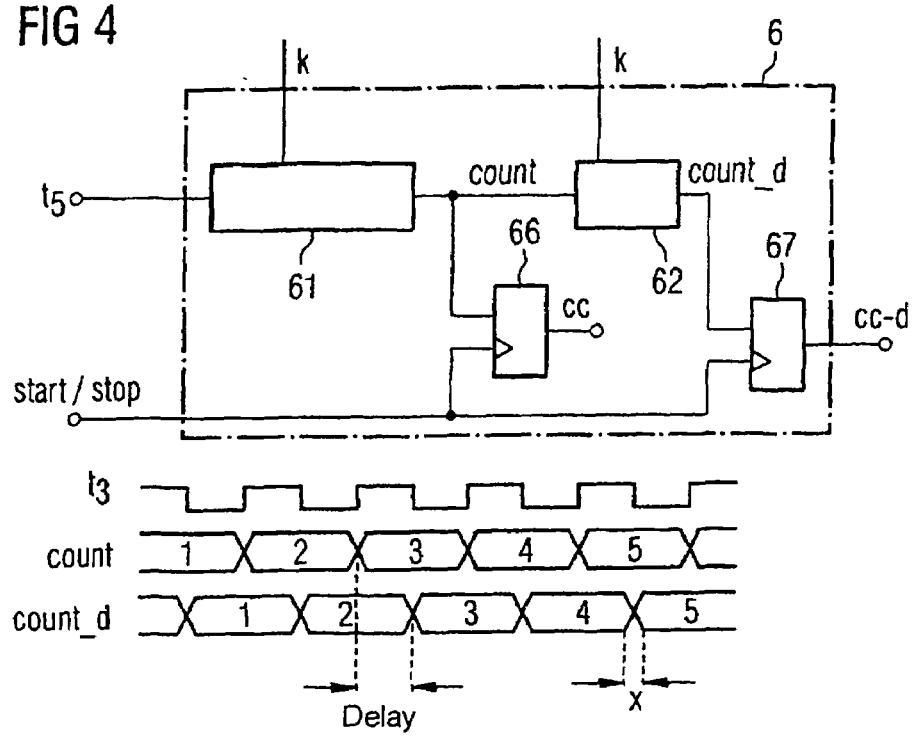

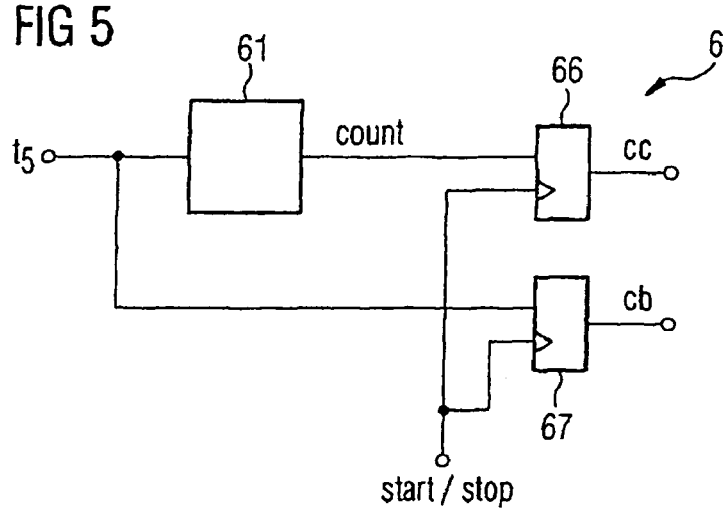
FIG 5
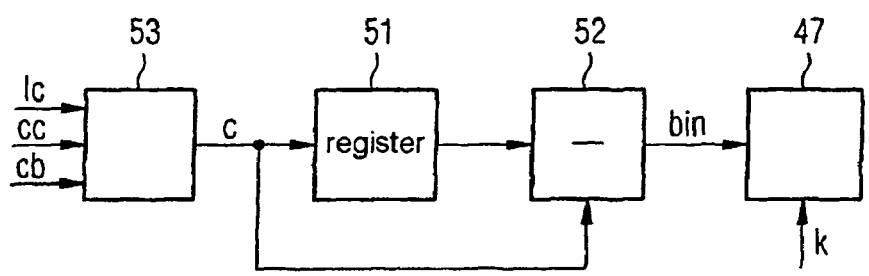
FIG 8
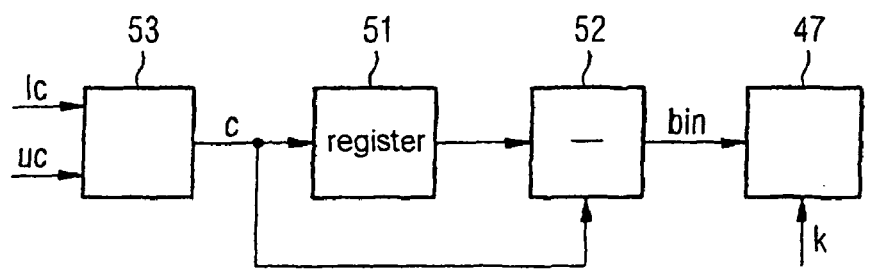

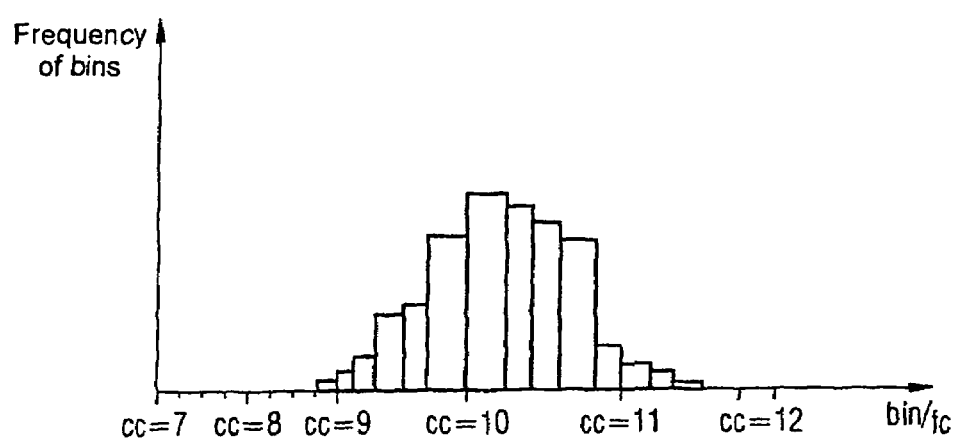

ELECTRICAL CIRCUIT FOR MEASURING TIMES AND METHOD FOR MEASURING TIMES

CROSS-REFERENCE TO RELATED APPLICATIONS

This Utility Patent Application claims priority to German Patent Application No. DE 10 2005 024 648.6, filed on May 25, 2005, which is incorporated herein by reference.

FIELD OF THE INVENTION

The present invention relates to an electrical circuit for measuring times and to a method for measuring times.

BACKGROUND

In integrated components which have clock generators and clock distribution networks for high frequencies, it is becoming more and more important to measure the quality of the clock generators and clock distribution networks. The quality of the clock generators and clock distribution networks is an important measured variable for fluctuations in production technology. Since these fluctuations may reduce the production yield of the integrated components, they must be measured, and thus detected, early. Due to the early detection, the production technology can be adapted so that the production yield is already increased in the early stages of running up production.

For high volume products having a short life cycle, particularly for short-lived consumer products, the detection of all relevant statistical data at a very early stage is very important. These data also include the period jitter parameter which is needed for the precise characterization of clock generators. Such a clock generator is constructed, e.g. as PLL (phase-locked loop) or as CDR (clock data recovery).

In the case of components in CMOS technologies having minimal pattern widths above 90 nm, the period jitter was frequently measured with high-resolution external test instruments during the characterization at individual test chips. In production, in contrast, this measurement was only taken at a selection of components, at the most.

For some applications, however, the measurement must be performed for all components during the production test. This applies, for example, to components which are installed in motor cars and in which the quality requirements are very high. Moreover, the external test instruments are very expensive; a production test using such external test instruments which would be performed for many components would unacceptably increase the test costs.

In US 2004/0061488, the jitter parameters of a PLL are generated with the aid of a module located on the integrated component. This module contains a ring oscillator of delay elements, a counter, which counts the number of clock cycles, being connected to the output of a signal delay element. A decoder which measures the subunits of the clock cycles is connected to the outputs of all delay elements. In this arrangement, however, the special requirements for highly precise measurements are not considered in which a resolution of the measurement of less than 10 picoseconds is required.

For these and other reasons, there is a need for the present invention.

SUMMARY

The present invention provides an electrical circuit used for measuring times. In one embodiment, the electrical circuit has a counter, a decoder and a multiplicity of time trap elements. At least the counter and the time trap elements are located together on an integrated semiconductor component. Each time trap element has a data input, a clock input, a delay output and a output port. The time trap element contains a delay element and a flip flop. The delay element outputs a signal change at the data input with a time delay at the delay output. The flip flop has a data input, a clock input and an output port, the data inputs, the clock inputs and the output ports of the flip flop and of the time trap element being connected to one another. The time trap elements are connected as ring oscillator.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 3 illustrates the variation with time of signals of the electrical circuit according to the invention for illustrating the measuring principle forming the basis of the invention.

FIG. 4 illustrates a block diagram of a counter used in the electrical circuit.

FIG. 5 illustrates a further illustrative embodiment of a correction block used in the electrical circuit according to the invention.

FIG. 8 illustrates two block diagrams for different embodiments for calculating the time intervals.

FIG. 10 illustrates a representation of measurement results generated by the circuit according to the invention.

DETAILED DESCRIPTION

Figure 1:
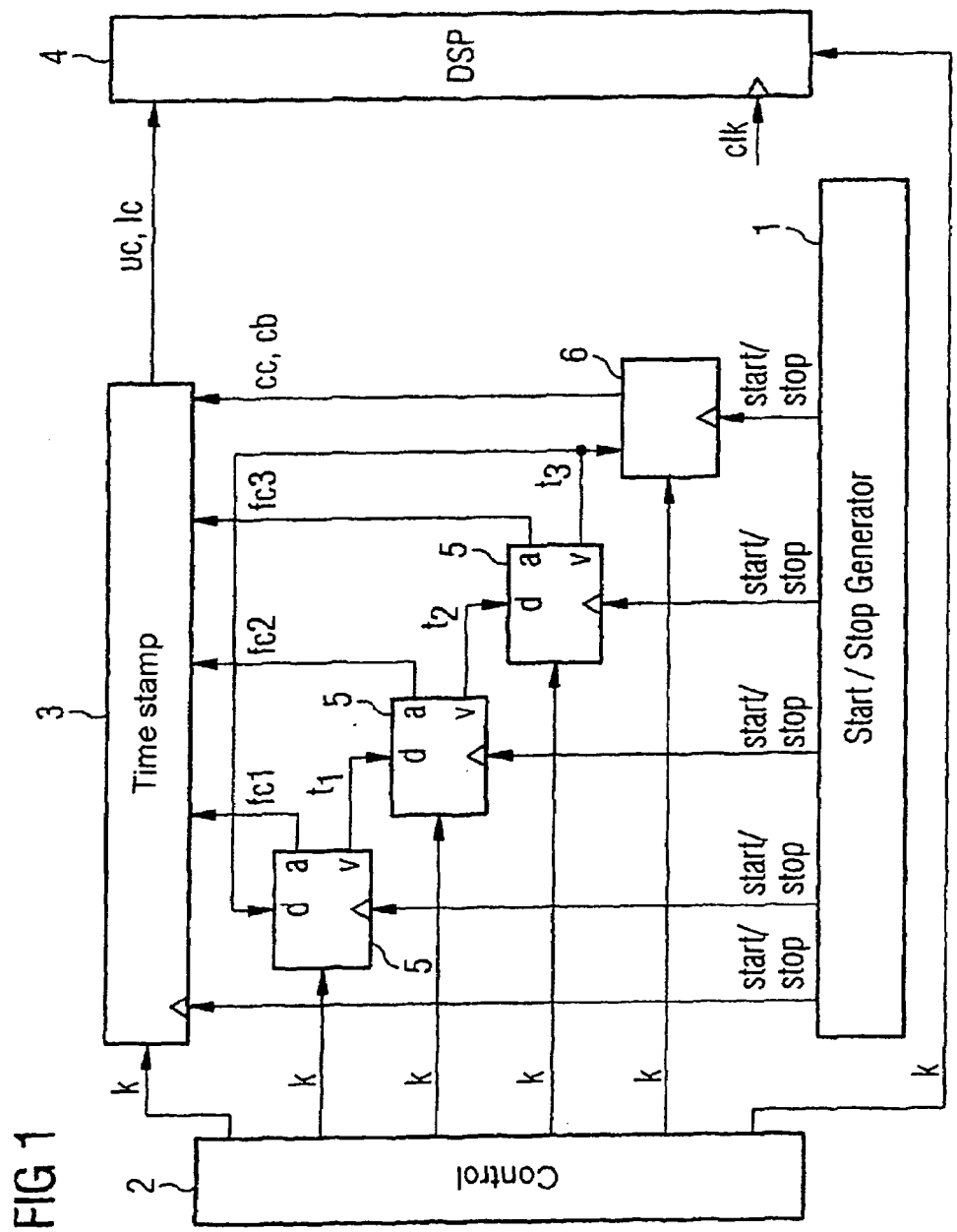
FIG. 1 illustrates an overview of the electrical circuit according to the invention for measuring times.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention provides an electrical circuit for measuring times by means of which a higher measurement resolution is achieved relative to known devices. The present invention provides a highly precise method for measuring times.

According to one embodiment of the invention, an electrical circuit for measuring times is provided. In particular, it is used for measuring time intervals, a time interval being understood to be the difference between two points in time. The electrical circuit has a counter, a decoder and a multiplicity of time trap elements. In this arrangement, at least the counter and the time trap elements are jointly integrated on a semiconductor component. The decoder is preferably also accommodated in the same integrated component. The time trap elements contain a clock input, a data input, a delay output and an output port. In addition, such a time trap element contains a delay element which outputs a signal change at the data input with a time delay at the delay output.

The time trap element contains a flip flop having a data input, a clock input and an output port. A flip flop stores a data item which is present at the data input and outputs it at its output. It depends on the signal at the clock input when the data item at the data input is transferred into the internal memory and when a stored data item is output at the output port. The data input of the flip flop is connected to the data input of the time trap element and the clock input of the flip flop is connected to the clock input of the time trap element. Similarly, the output port of the time trap element is at the same time the output port of the flip flop.

The time trap elements are connected as a ring oscillator. In this arrangement, a data input of a time trap element is in each case coupled to the delay output of another time trap element. The ring thus formed contains an odd number of inverting elements, also called inverters, so that a signal edge circulating in the ring provides for oscillation.

The counter is connected to the output port of a time trap element and the decoder is connected to the output ports of all time trap elements. As a result, the counter counts the clock periods of the oscillation while the decoder measures the subunits of the clock periods.

The delay element and the flip flop of each time trap element are arranged close to one another. Due to the small distance between the delay element and the flip flop, the line lengths between these two components are short. There are thus no different delays on these line lengths which impair the precision of the measurement result.

In addition, the risk of the quality of the input signal of the flip flop being impaired by other signals being inductively or capacitively coupled in is reduced. At the same time, the delay element and the flip flop can be connected to the same supply voltage lines so that there are no differences in the switching time between the delay element and a flip flop due to different supply voltage. The signal line driven by the output port of the flip flop can be longer without the precision of the measurement being restricted. The reason for this is that the signal at the output port is generated from the stored value in the flip flop and is no longer as time-critical as the data input signal of the flip flop.

In one embodiment of the invention, the distance between the delay element and the flip flop is less than the largest distance between the flip flops of different time trap elements. Thus, the flip flops of different time trap elements are not arranged in one block together but are adjacent to the delay elements.

Another delimitation is formed by the criterion that the distance between the delay element and the flip flop is less than the largest distance between three flip flops of adjacent time trap elements. Adjacent means here that are arranged directly next to one another without further time trap elements being located between them. This criterion is particularly suitable in the case of ring oscillators having many delay elements in which there is a large number of delay elements and thus also of flip flops.

Another embodiment of the invention relates to a correction device which is provided in the electrical circuit. The correction device corrects the output value of the counter. Due to the fact that the counter and the time trap elements are implemented by different components, there may be slight delays between the switch-over of the counter and the switch-over of the flip flops. The delays can also result from different connections of the counter and of the flip flops so that different disturbances at the connections lead to different switch-over times. In the case of different switch-over times, the counter already switches although the flip flops and the downstream decoder have not yet switched. In the other fault case, the decoders have already switched but the counter has not yet switched over. In both cases, uncorrected reading of the counter and decoder value would provide a wrong measurement result. The error would be as large as one clock period.

In one embodiment of the invention, the electrical circuit also has a start/stop generator, the output of which is connected to the clock inputs of the time trap elements via clock lines. In this arrangement, the clock lines are arranged in such a manner that the delays from the start/stop generator to the flip flops of the time trap elements are essentially identical in each case. This is due to the fact, for example, that the clock lines are identical for all delay elements. Different line lengths would falsify the measurement result so that the required measurement accuracy of less than 10 picoseconds would not be guaranteed. "Essentially" means here that the delays vary by less than 4 ps and preferably vary by less than 2 ps.

The supply lines for the voltage supply are preferably arranged in such a manner that the supply lines supplying the delay elements are separate from the supply lines for other parts of the electrical circuit. This results in a resistance between the supply lines for the time trap elements and the supply lines for the other parts. In addition, capacitors are attached to the supply lines for the delay elements. Together with the abovementioned resistance between the various supply lines, these act as low-pass filters for high-frequency voltage peaks which are generated by the other parts of the electrical circuit.

In a further embodiment, the supply lines for the time trap elements are separated from the supply lines for the other parts of the electrical circuit in such a manner that they are connected to different contact pads. They are supplied via various external connecting lines such as flip chip contacts or bonding wires which are connected to the contact pads. The supply lines are thus separated in such a manner that the supply for the time trap elements is not influenced by any disturbances generated on the semiconductor component.

In one embodiment of the invention, only a single time trap element is inverting, that is to say at its delay output a signal is output, the level of which is inverted with respect to the signal at the data input. At the same time, the other time trap elements are non-inverting. This simplifies the implementation of the decoder which only needs to take into consideration that an inversion is present.

By providing an odd number of time trap elements, all of which output the signal at the data input inverted after a delay, it is possible to ensure that all time trap elements have the same delay. This simplifies the evaluation of the subunits of the clock periods which can simply be read out at the output ports of the delay elements. Thus, no recalculation taking into consideration the different delay times of the delay elements is necessary.

The number of time trap elements, and thus of the inverting elements, is preferably a prime number. This ensures that the oscillator only oscillates at one frequency.

The counter value can be corrected with the aid of a delayed output signal of the counter as a result of which the count is unambiguously correlated with the clock period. However, it must be specified when the delayed output signal is processed further and when the undelayed output signal of the counter is processed further. This is appropriately specified with the aid of the output signals of the decoder.

The correction with the aid of a delay element in the counter is especially recommended for ring oscillators having long clock periods. Although the synchronization of the counter is still in the time-critical path, due to the provision of the delay element it is not quite as critical as the synchronization in the time trap elements.

The correction can also be effected by means of a signal at an output of the time trap elements. In this case, it is not only the counter signal but also an output signal of time trap elements which is synchronized. Both of the synchronization circuits are located in the time-critical path. The synchronization of the output signal of the time trap elements should, therefore, have the same delay as the flip flops of the time trap elements. It is thus possible to correct the delay of the counter.

If the counter has a flip flop for evaluating an output signal of one of the time trap elements and the flip flop generates the correction signal for the counter, the synchronization of the correction signal is effected in the same manner as the synchronization in the delay elements. This improves the measuring accuracy.

By providing an adjustable delay of the delay elements, the ring oscillator can be operated at different frequencies. This makes it possible to specify whether time intervals which are as long as possible can be measured with less resolution or shorter time intervals can be measured with greater resolution. If the delay is adjusted via connectable capacitors, the delay can also be adjusted via very fine gradings in the picosecond range.

Providing a reset device sets the delay outputs of the time trap elements to a predetermined value. The ring oscillator is interrupted by the reset device and the electrical circuit no longer oscillates. Resetting makes it possible to specify a fixed value at the beginning of a measurement in order to start the measurement from a known state of the ring oscillator.

In one embodiment, the ring oscillator is always reset in the times in which no measurements are made. As a result, no unnecessary power is consumed by the ring oscillator.

In a preferred embodiment of the invention, an evaluating circuit is provided which measures the distance between two points in time. The two points in time are obtained by changing the levels of the clock signal, for example by rising edges of the clock signal. The time interval is calculated by comparing the output values of the counter and of the decoder at the different points in time. This is done, for example, by forming a difference of the output values.

For the evaluation, the measured time intervals are preferably divided into measuring ranges. Such a measuring range includes, e.g. all time intervals between 1010 ps and 1020 ps. Per measuring range, there is in the evaluating circuit a result counter which is incremented as soon as the measured time period belongs to the measuring range. As a result, an event, for example a delay, can be measured several times; the results are stored in the counters and from the counter values a frequency distribution can be read. From such a frequency distribution, the time interval to be measured is calculated, for example by averaging, or existing measurement errors are inferred by evaluating the standard deviation of the frequency distribution.

If the size of the measuring range is adjustable, the measurement can be performed with different resolutions. Depending on the distribution of the measurement results, the measurement can be performed with greater accuracy or in an extended measuring range.

If the electrical circuit is constructed from purely digital components, it can be generated automatically with the standard methods for developing digital circuits. In addition, the characterization of purely digital circuit blocks is easier than the characterization of mixed analog/digital circuit blocks.

The electrical circuit according to the invention is preferably integrated on a semiconductor chip together with another circuit which is being tested with regard to its timing characteristic. As a result, no external measuring configuration is necessary. In addition, a number of semiconductor chips can be tested at the same time.

According to one embodiment of the invention, a method for measuring times by means of an electrical circuit is also provided. The method has a process a) according to which a control variable i is set to 0. In addition, a number k of measurement iterations and a magnitude G of measuring ranges is specified. After that, at least two signal changes of a clock signal are generated in the start/stop generator in a process b). The two signal changes take place at two different points in time.

The output values which are measured at the points in time of the signal change are read at the decoder and the counter in process c). From the output values, numerical values are calculated for the two points in time. In a process d), the difference is formed from the calculated numerical values which thus specifies a measure for the time interval between the points in time. The difference thus formed is correlated with a measuring range in a process e). The result counter which belongs to this measuring range is incremented, i.e. the numerical value present in the result counter is incremented by 1.

Following this, the control variable i is incremented in a process f) and in a process g) it is determined whether the control variable i is less than or equal to the number of measurement iterations k. In this case, the process continues with process b). If i is greater than k, the method ends or other measurements follow.

The output value of the counter is preferably corrected before process d). This prevents reading errors produced by different switching responses of the decoder and of the counter from falsifying the measurement result.

In a further development of the invention, process g) is followed by a process a') in which the control variable i is reset to 0 and the magnitude G of the measuring ranges is changed by either reducing or enlarging the measuring ranges. Following this, the method is continued with processes b) to g). If it is found in the first measuring loop that the measuring range is too large, the measuring range is reduced in order to increase the resolution of the measurement result. In the reverse case, the measuring range is enlarged so that no measurement results remain uncounted because they do not belong to any measuring range.

If after process g) the delay of the delay elements is changed and the method is continued with processes b) to g), the measurement is repeated with changed measuring accuracy. Preferably, the parameters of a random distribution are calculated and output from the contents of the counters after a process g). From these parameters, the distribution of the measured quantities and the influence of measuring errors can be inferred.

The method specified generates a multiplicity of measurement values, the results of which can be read from the contents of the result counters as frequency distributions. As a result, mean values, standard deviations and other statistical quantities of the distribution of the measurement results can be determined. If, for example, the same parameter is measured several times and the measurement results are averaged by means of the method specified, the accuracy of the measurement result is improved compared with a single measurement.

In one embodiment, the ring oscillator is allowed to run freely for some time before beginning the measuring process so that its frequency stabilizes.

FIG. 1 illustrates in an overview a block diagram in which the electrical circuit according to the invention and drive and evaluating circuits are illustrated in an overview.

The device contains a start/stop generator 1, a control block 2, a time stamp block 3, an evaluating device 4, three time trap elements 5 and a counter 6.

The control unit 2 generates the control signal k which controls the time trap elements 5, the counter 6, the time stamp 3 and the evaluating device 4. The control signal k is formed as a digital signal with a data word width of greater than 1 and can thus drive different components of the electrical circuit independently of one another.

The start/stop generator 1 generates the start/stop clock signal which drives the clock inputs of the time trap elements 5 and the counter 6. The clock signals which control the time trap elements 5 and the counter 6 are particularly critical for the measurement. Fluctuations in the delays on these lines falsify the measurement result. For this reason, the start/stop clock lines are designed in such a manner that all of them have the same delay.

The start/stop clock signal which operates the time stamp is not as time-critical since the time-critical synchronization already takes place in the time trap elements 5 and the counter 6.

In the illustrative embodiment shown, the clock input of the evaluating device 4 is operated by an external clock clk, but could also be operated by the start/stop signal.

The signals t1, t2 and t3 are provided by the time trap elements 5 in each case at their delay output designated by v. The time trap elements 5 have another output, the output port designated by a.

The three time trap elements 5 shown are connected as a ring oscillator. This is due to the fact that the data inputs d of the time trap elements 5 are in each case connected to delay outputs v of another time trap element 5. Thus, the data input d of the first time trap element 5 is connected to the delay output v of the third time trap element 5 via the signal t3. Similarly, the data input d of the second time trap element 5 is connected to the delay output v of the first time trap element 5 via the signal t1 and the data input d of the third time trap element 5 is connected to the delay output v of the second time trap element 5 via the signal t2. The ring-connected chain of time trap elements 5 exhibits an odd number of inverters as a result of which an oscillation is generated which allows a clock edge to run through the signals t1, t2 and t3.

The free-running ring oscillator has the effect that the circulating clock edge can only ever stop at one time trap element within a defined time resolution, for example 10 ps.

The signals fc1, fc2 and fc3 provided at the output ports a of the time trap elements 5 form input signals for the time stamp 3. In addition to the control signal k and the start/stop signal, the counter 6 receives the signal t3, the edges of which are counted by the counter 6. The count of the counter and the output signals of the flip flops 10 together provide the information for the time stamp 3.

In a full-wave counter, the counter is incremented either with each rising edge or with each falling edge of the signal t3 whereas in the case of a half-wave counter, the value stored in the counter is incremented both with the falling edge and with a rising edge. The counter 6 outputs the counting signal cc and the correction signal cb which are input signals for the time stamp 3. The time stamp 3 decodes the input signals fc1, fc2, fc3, cc and cb and outputs the signals uc and lc as output values to the evaluating unit 4. The evaluating unit 4 evaluates the signals uc and lc. The evaluating unit 4 is identified by DSP since it is implemented by a digital signal processor in one embodiment. The evaluating unit 4 could also be built up out of standard digital logic gates. The time trap elements contain flip flops so that the distance between the delay elements and the flip flops is as short as possible. As a result, the signals t1, t2 and t3 are picked up at identical points in time.

Figure 2A:
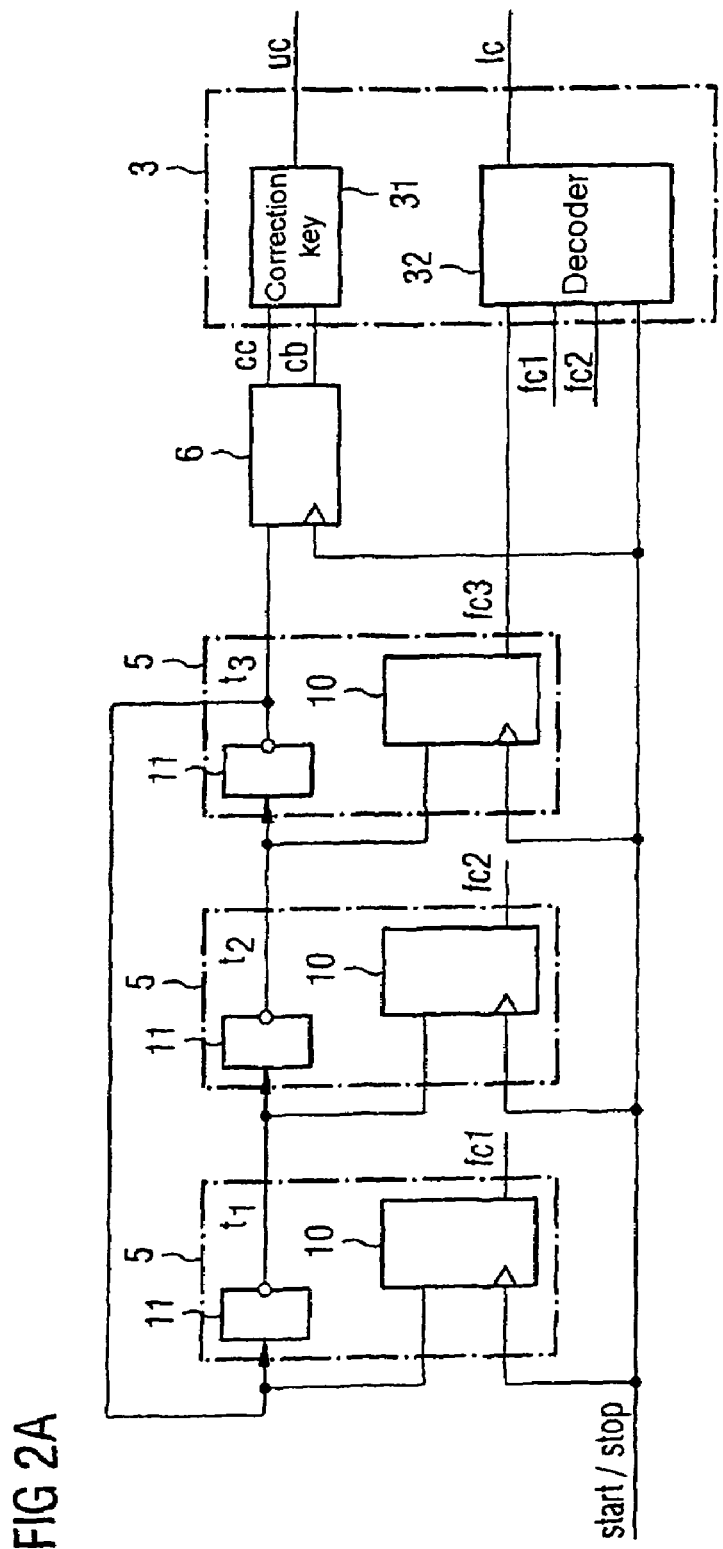
FIGS. 2A to 2E illustrate details of blocks illustrated in FIG. 1.

FIG. 2A illustrates details of components shown in FIG. 1. Components having the same functions as in the preceding figures are identified by identical reference symbols and not explained separately.

The time trap elements 5 in each case contain a delay element 11 and a flip flop 10. The delay elements 11 are in each case inverting so that the three inverter stages with feedback form a ring oscillator. The half clock period of the ring oscillator (in the example of the full-wave counter) is obtained from the sum of the delays of the delay elements 10. The data inputs of the time trap elements 5 are connected both to the delay element 11 and to the flip flop 10 with its data input. The output of flip flop 10 forms the output port a of the time trap element 5 and the output of the delay element 11 outputs the signal at the delay output v of the time trap element. The delay element 11 contains an inverter so that the signal at the data output represents the delayed inverted signal at the data input.

A clock edge runs along the signals t1, t2 and t3 through the delay elements 5. During this process, only one of the signals t1, t2 and t3, at the most, is simultaneously changed. If a start/stop signal is applied in such a manner that the flip flops 10 receive the alternating clock edge of the start/stop signal at the same times, the value present for this clock edge at the signal t1, t2 and t3 is stored and output at the output ports fc1, fc2 and fc3.

The time stamp 3 contains a correction block 31 and a decoder 32. The counter 6 counts the clock edges of the signal t3. It outputs the counting value cc and the correction value cb as output values to the correction block 31 of the time stamp 3.

The decoder 32 receives the output signals fc1, fc2 and fc3 provided by the flip flops 10. The decoder 32 outputs at its output the signal lc which specifies the levels at which the signals t1, t2 and t3 were at the point in time of the rising start/stop edge. The signal uc provided by the correction block 31 outputs the number of clock cycles and the signal provided by the decoder 32 outputs the number of subunits of the clock period. In the example shown in FIG. 2A, the subunits correspond to one third of the half clock period (in the example of the full-wave counter).

Figure 2B:
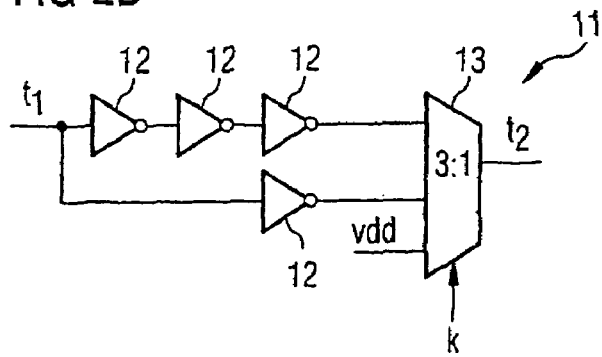

FIG. 2B illustrates details of the first delay element 11. It contains four inverters 12 and a multiplexer 13. It receives as input signals t1 the control signal k and a signal which is constantly at the potential of the supply voltage vdd. The signal t2 serves as the output signal of the delay element 11. The input signal t1 is connected to the first input of the multiplexer via three series-connected inverters and to the second input of the multiplexer via a single inverter. The signal with the constant voltage level vdd is connected to the third input of the multiplexer. Depending on the value of the control signal k, one of the inputs of the multiplexer 13 is connected to the output t2.

The possibilities thus exist that the delay of the delay element 11 is either the delay of three inverters plus the delay of the multiplexer or the delay of an inverter plus the delay of the multiplexer. As a third possibility, the output signal t2 is set to a constant value. This so-called reset function enables the ring oscillator to be interrupted and the signals t1, t2, and t3 to be set to a predetermined value.

Figure 2C:
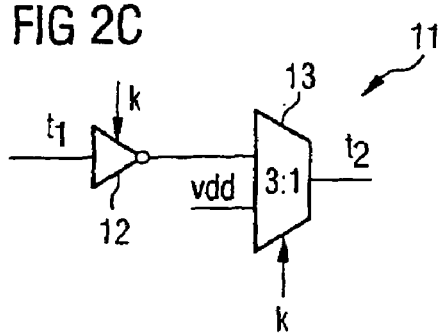

FIG. 2C illustrates another illustrative embodiment of the first delay element 11. It contains an inverter 12 and a multiplexer 13. It receives ti, the control signal k and a signal which is constantly at the potential of the supply voltage vdd as input signals. The signal t2 serves as the output signal of the delay element 11. The input signal t1 is connected to the first input of the multiplexer via a single inverter. The signal with the constant voltage level vdd is connected to the second input of the multiplexer 13. Depending on the value of the control signal k, one of the inputs of the multiplexer 13 is connected to the output t2.

By means of the signal k, the delay of the inverter 12 can also be changed, for example by connecting a capacitor to the output of the inverter 12. This capacitor can be formed, e.g. as gate of an MOS transistor.

Figure 2D:
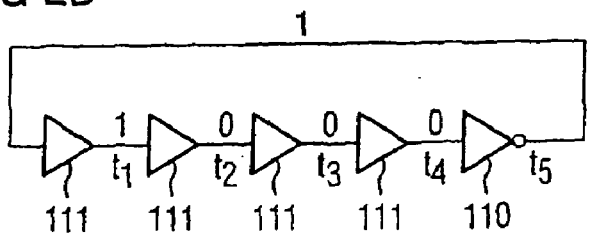
Figure 2E:
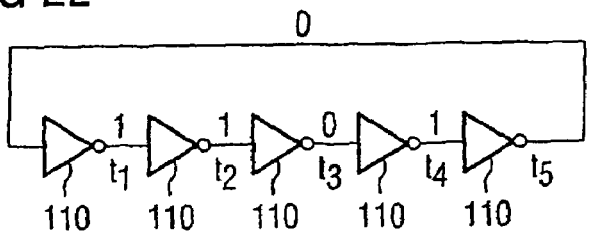

FIGS. 2D and 2E illustrate two different implementations of ring oscillators. These are in each case five delay elements which are connected in the form of a ring.

In FIG. 2D, this ring consists of four buffers 111 and one inverter 110. The buffers 111 are non-inverting whereas the inverter 110 outputs at its output a signal, the level of which is inverted with respect to the level of the input signal. The buffers 111 consist, for example, of two series-connected inverters. The output signals of the first, second, third and fourth buffer 111 are designated by t1, t2, t3 and t4, respectively, whereas the output signal of the inverter 110 is designated by t5.

Above the signal line t1 to t5, the signal levels are in each case drawn at an arbitrarily selected point in time. The signal levels of the signals t5 and t1 are equal to one and those of the signals t2, t3 and t4 are equal to zero. It can be seen that the signal levels are different at the input and at the output of the second buffer although the second buffer 111 is non-inverting. The reason for this is that the input signal is output only with a delay at the output. After this delay, the signal t2 will also be switched over to one. After a further delay in the third buffer 111, the signal t3 will also be switched over. This illustrates how the clock edge of the oscillator moves along from one output signal of a delay element 5 to the output signal of the next delay element 5.

In FIG. 2E, all delay elements consist of inverters. It is only at the second delay element 110 that the level at the data output t2 is not inverted with respect to the data input t1. The reason for this is that an inverter 110 has a delay time which is needed for outputting the inverted signal at the data output after a signal change at the data input. After this delay time, the signal t2 will be switched to zero whereupon the signal t3 will be switched to one again after a further delay time.

In addition to the illustrative embodiments in FIGS. 2D and 2E, intermediate stages are also possible in which a number of delay elements is odd, greater than 1 and at the same time less than the number of delay elements.

FIG. 3 illustrates the variation with time of the signals at nodes of the electrical circuit according to the invention. In this context, a ring oscillator having nine delay elements is illustratively shown, only one delay element 11 being inverting. The signal t9 is connected to the delay output v of one of the delay elements 11. The signal t9 is connected to the input of the counter 6. The signal t9 has the form of a clock signal, the clock period being the result of the sum of the delays for all nine delay elements 11.

The count signal reproduces the content of the counter 6. This content is incremented as soon as the level of the signal t9 changes. The counter 6 is thus a half-wave counter.

As soon as the start/stop signal has an e.g. rising clock edge, the values of the counter 6 and of the delay elements 5 are read out. The first rising edge of the start/stop signal occurs at the point in time T1. The signals t1 to t9 present at the data inputs of the flip flop 10 are read at the point in time T1 and stored in the flip flops 10. The stored values are output as output signals fc9 to fc1=[111110000] during the time in which the start/stop signal is at the high level. The output signals fc9 to fc1 are evaluated by the decoder and processed in an evaluating unit. At the point in time T1, the content of the counter 6 is also read out. At the point in time T1 this is "three". At the point in time T2, the counter outputs the value "nine" and the flip flops 10 output the value [111111000].

In the evaluating unit 4, the difference between the output values at the point in time T2 and the point in time T1 is then formed.

In the chosen example, a signal edge requires "nine" subtime units before it has circulated once around the entire ring. Let the subunit be called $\delta t$. A clock period is thus equal to 9 $\delta t$. The time interval between T2 and T1 is $((9-3)*9+1)*\delta t$ which is equal to 55 $\delta t$.

FIG. 4 illustrates an embodiment of the correction circuit for the counter 6 and the associated signal variations. The circuit diagram illustrates the counter 6. The counter 6 contains a counting mechanism 61 and a delay element 62, a first flip flop 66 and a second flip flop 67. At the input of the counting mechanism 61, the signal t5 is connected in the example of five trap elements. The counting mechanism 61 outputs the signal count which, on the one hand, is connected to the data input of the first flip flop 66 and, on the other hand, to the input of the delay element 62. The signal count is a signal having a word width of greater than 1. In consequence, the first flip flop 66 and the second flip flop 67 have a number of inputs and outputs for data.

The output of the delay element 62 is connected to the signal count_d. The delay element 62 is also adjustable by means of the control signal k. The delay is preferably adjusted in such a manner that it is a half clock period. The clock period is obtained from double the number of delays of the time trap elements (in the example of the full-wave counter). For this reason, the delay of the delay element 62 is usually matched to the delays of the delay elements of the time trap elements 5.

The signal count_d is received by the data input of the second flip flop 67. The first flip flop 36 and the second flip flop 67 in each case receive the start/stop signal at their clock inputs. The first flip flop 66 outputs the signal cc and the second flip flop 67 outputs the signal cc_d. As can be seen from the signal variations, the counting mechanism 61 counts, the rising clock edges of the signal t5 in the present example. The counting mechanism 61 is thus a full-wave counter. This, too, is adjustable via the control signal in order to be able to program a starting value.

The signal count_d is formed by the delay of the signal count. In the signal variations, the values of the signals count and count_d signals are drawn as decimal numbers. The delay between these two signals is obtained from the time interval between the signal changes of both signals. In this context, evaluating the reading of a signal which has just changed its value is susceptible to errors. For example, count_d should not be processed further in the time interval designated by X. Instead, the count signal should be accessed in this time interval. If a reading error occurs, the value read is wrong by an entire clock period, as a rule.

In the table following it will be shown which of the signals are used for avoiding the errors described above.

The signals of a ring oscillator t1 to t5 change as specified in the table. The counter 6 is connected to the signal t1 and counts the rising clock edges. The signal cb is obtained from the signal cc and the delay produced by the delay element 62. At most points in time, the signal cc read by the count signal is processed further. Shortly before the signal change, however, the signal cc_d is used and shortly after the signal change a signal resulting from the content of the cc_d value added to the value "one" is used. Further processing is not time-critical and occurs in the evaluating device 4.

| $t_1$ | $t_2$ | $t_3$ | $t_4$ | $t_5$ | cc | cc_d | Further processing of the signal |
|---|---|---|---|---|---|---|---|
| 1 | 1 | 1 | 1 | 1 | 1 | 1 | cc |
| 0 | 1 | 1 | 1 | 1 | 1 | 1 | cc |
| 0 | 0 | 1 | 1 | 1 | 1 | 1 | cc |
| 0 | 0 | 0 | 1 | 1 | 1 | 1 | cc |
| 0 | 0 | 0 | 0 | 1 | 1 | 1 | cc_d |
| 0 | 0 | 0 | 0 | 0 | 1 | 1 | cc_d |
| 1 | 0 | 0 | 0 | 0 | 2 | 1 | cc_d + 1 |
| 1 | 1 | 0 | 0 | 0 | 2 | 1 | cc_d + 1 |
| 1 | 1 | 1 | 0 | 0 | 2 | 1 | cc |
| 1 | 1 | 1 | 1 | 0 | 2 | 2 | cc |
| 1 | 1 | 1 | 1 | 1 | 2 | 2 | cc |
| 0 | 1 | 1 | 1 | 1 | 2 | 2 | cc |
| 0 | 0 | 1 | 1 | 1 | 2 | 2 | cc |
| 0 | 0 | 0 | 1 | 1 | 2 | 2 | cc |

FIG. 5 illustrates a further illustrative embodiment for the correction of the counter value. The counter 6 with a counting mechanism 61, a first flip flop 66 and a second flip flop 67 are shown. The first flip flop 66 is connected to the count signal with its data input and the second flip flop 67 is connected to the signal t5 with its data input. The start/stop signal is connected to the clock inputs of the first flip flop 66 and of the second flip flop 67. The counting mechanism 61 receives the input signal t5 and outputs the count signal. The first flip flop 66 outputs at its output the cc signal and the second flip flop 67 outputs as its output the cb signal.

The cc signal evaluates the signal t5 as soon as the start/stop signal exhibits a changing edge (in the example of the half-wave counter). The signal cb stored by the second flip flop 67 and provided at its output is used for correcting the counter value cc read.

The following table illustrates the correction of a counter value cc read. In it, the edges of a signal t1 are counted.

| $t_1$ | $t_2$ | $t_3$ | $t_4$ | $t_5$ | cb | cc | Correction |
|---|---|---|---|---|---|---|---|
| 1 | 1 | 1 | 1 | 1 | 1 | 2 | |
| 0 | 1 | 1 | 1 | 1 | 0 | 3 | |
| 0 | 0 | 1 | 1 | 1 | 0 | 3 | |

-continued

| $t_1$ | $t_2$ | $t_3$ | $t_4$ | $t_5$ | cb | cc | Correction |
|---|---|---|---|---|---|---|---|
| 0 | 0 | 0 | 1 | 1 | 0 | 2 | cc + 1 |
| 0 | 0 | 0 | 0 | 1 | 0 | 3 | |
| 0 | 0 | 0 | 0 | 0 | 0 | 3 | |
| 1 | 0 | 0 | 0 | 0 | 1 | 3 | cc + 1 |
| 1 | 1 | 0 | 0 | 0 | 1 | 4 | |
| 1 | 1 | 1 | 0 | 0 | 1 | 4 | |
| 1 | 1 | 1 | 1 | 0 | 1 | 4 | |
| 1 | 1 | 1 | 1 | 1 | 1 | 4 | |
| 1 | 1 | 1 | 1 | 1 | 1 | 4 | |
| 0 | 1 | 1 | 1 | 1 | 0 | 4 | cc + 1 |
| 0 | 0 | 1 | 1 | 1 | 0 | 5 | |

The correction signal cb also measures the signal value of the signal t1. cb thus has the same value as the signal fc1. Whenever both cb is equal to 0 and cc is even-numbered, an error is detected and the counter value read is incremented by 1. The same correction takes place if cc=1 and cb is odd-numbered.

Figure 6:
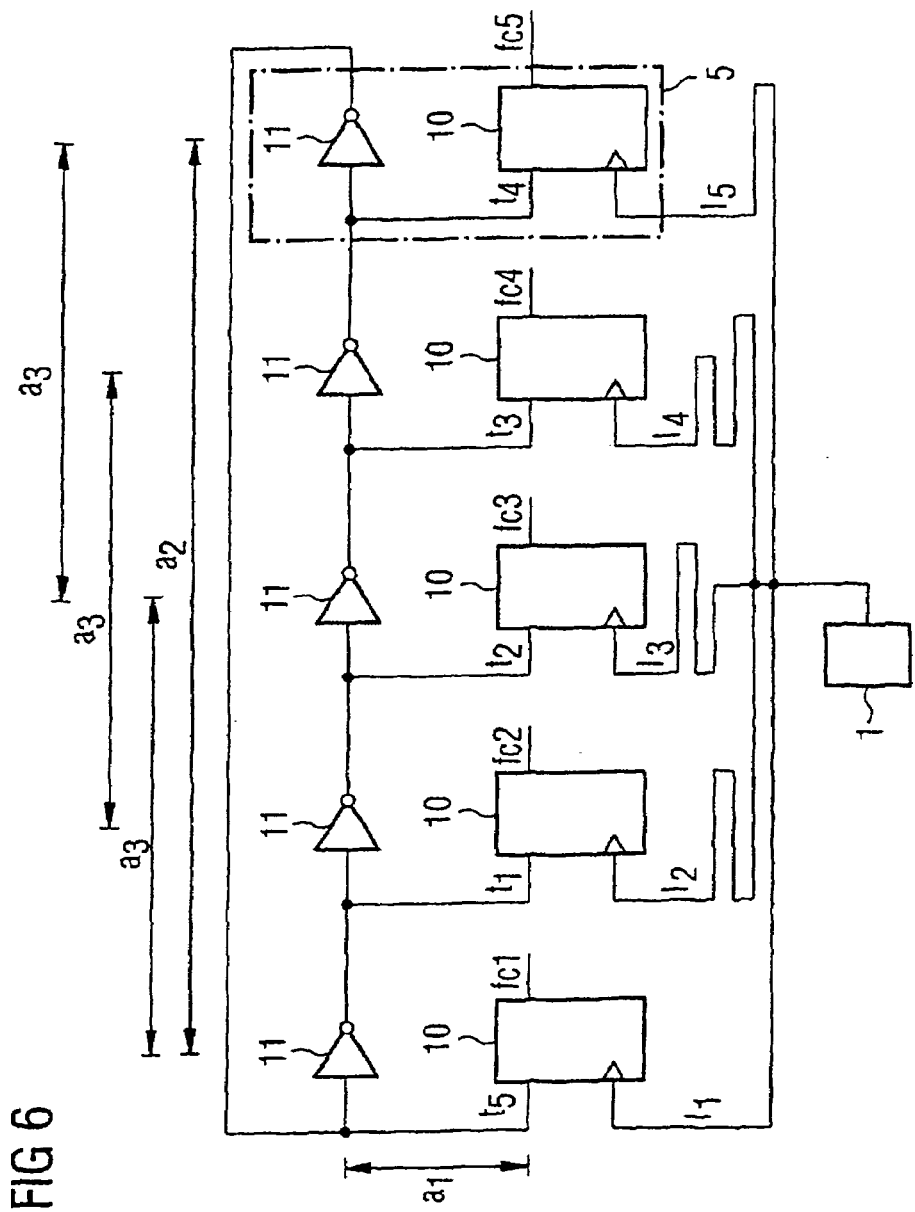
FIG. 6 illustrates the arrangement of the lines for clock signals running in the electrical circuit.

FIG. 6 illustrates the arrangement of the time trap elements in a diagrammatic overview. Five time trap elements 5 having in each case one delay element 11 and one flip flop 10 are illustrated. The time trap elements 5 are arranged in such a manner that the delay elements 11 and flip flops 10 are close to one another. The distance between these two blocks is identified by a1. Due to the fact that a1 is short, the signals t1 to t5 reach the delay element 11 and the flip flop element 10 of a time trap element 5 at the same time. The length of the signal lines fc1 to fc5 is correspondingly extended. However, this is not critical since more time is available for evaluating the signals. The distance between the first and the last flip flop 10 is identified by a2. In the example shown, the distance a2 is greater than the distance a1. The distance a3 designates the greatest distance of flip flops of three adjacent time trap elements and a3 is also greater than a1.

The start/stop generator 1 generates the start/stop signal and drives it to the flip flops 10 via the lines l1 to l5. The lines l1 to l5 are designed in such a manner that their line lengths are in each case equal. For this purpose, the lines are partially meandering. To render the delays over the lines l1 to l5 to be uniform, it is also necessary that the lines l1 to l5 exhibit similar coupling capacitances as other lines. These coupling capacitances can be calculated by simulation in order to correspondingly adapt to the design of the lines.

Figure 7:
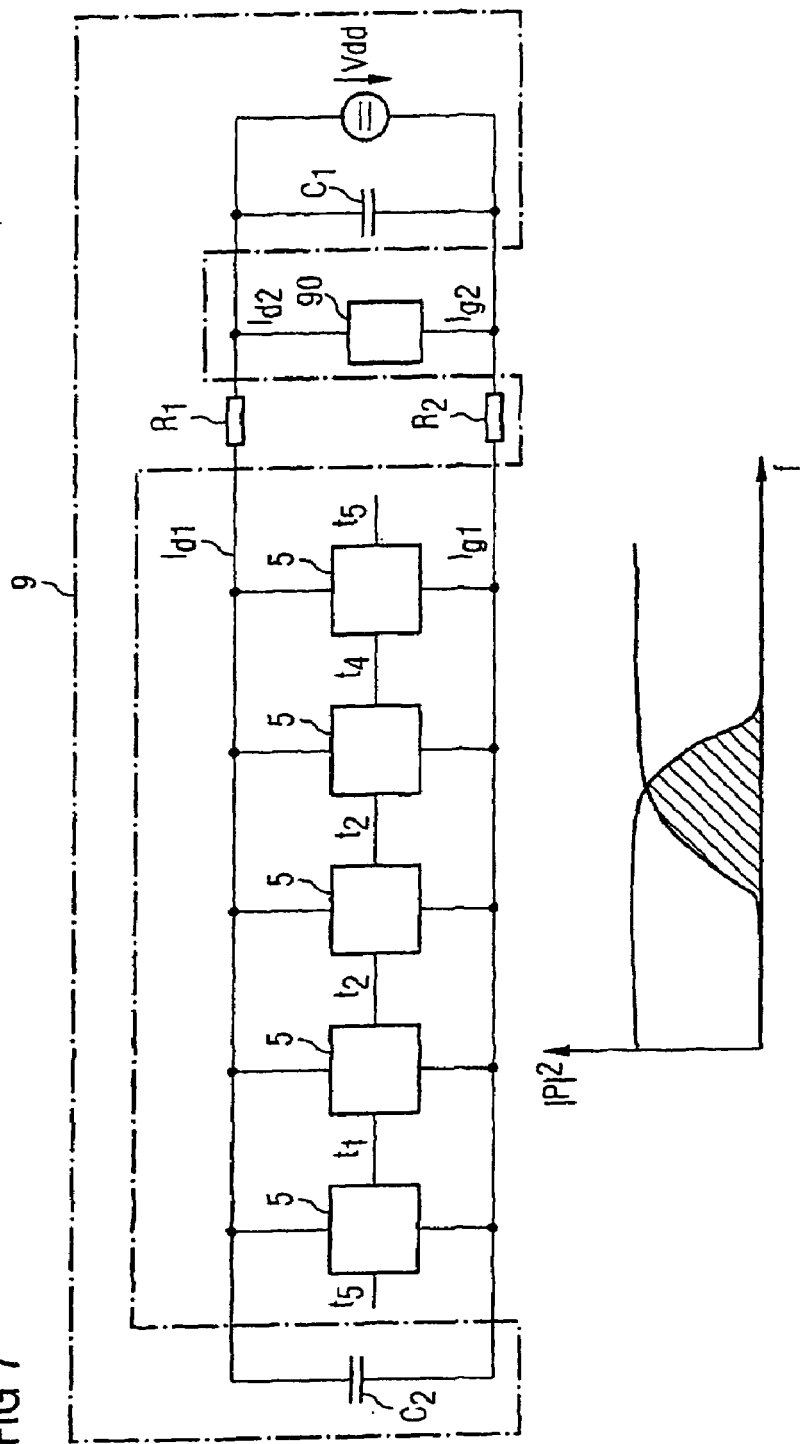
FIG. 7 illustrates the arrangement for supply lines used in the electrical circuit.

FIG. 7 illustrates a ring of time trap elements 5 and the associated power supply 9. The power supply 9 supplies the time trap elements 5 and other parts of the electrical circuit 90 and has a voltage source Vdd, two resistors R1, R2 and two capacitors C1 and C2. The lines ld1 and lg1 supplying the time trap elements 5 are connected to the voltage source Vdd via the resistors R1 and R2. The other parts of the electrical circuit 90, for example the start/stop generator and the evaluating device, are connected via the supply lines ld2 and lg2.

A capacitance C2 is applied at the time trap elements 5 and a capacitance C1 is applied at the power supply. The arrangement of resistors and capacitors forms a band-pass filter for the signals on the voltage supply lines. Such a one is produced by superimposing a high-pass filter and a low-pass filter as shown in the lower part of FIG. 7. Frequencies which are not completely suppressed and thus kept away from the time trap elements are only shown in the shaded areas. This is desirable for suppressing very high-frequency and very low-frequency interference generated by the other parts of the electrical circuit.

FIG. 8 illustrates signal flow diagrams for an evaluation of the measured values in various embodiments.

The evaluating devices in each case contain a calculating unit 53, a register 51, a subtracting element 52 and an evaluating counter 47.

The evaluating device in the embodiment shown above receives the signals lc, cc and cb. In the calculating unit 53, the counter value cc is corrected by means of the correction signal cb. Following this, the measurement value c for the measured point in time is assembled from the signal lc and the corrected counter value. Since the values are measured for two different points in time, the value measured first is stored in the register 51.

In the subtracter 52, the difference of the measured values at the two points in time is calculated. This difference is output to the evaluating counter 47 as signal bin. The control signal k is connected to the evaluating counter 47 and is used, for example, for adjusting the magnitude of the measuring ranges.

In the embodiment illustrated at the bottom in FIG. 8, the calculating unit 53 receives the signal lc and the counter signal uc which is already correct.

Figure 9:
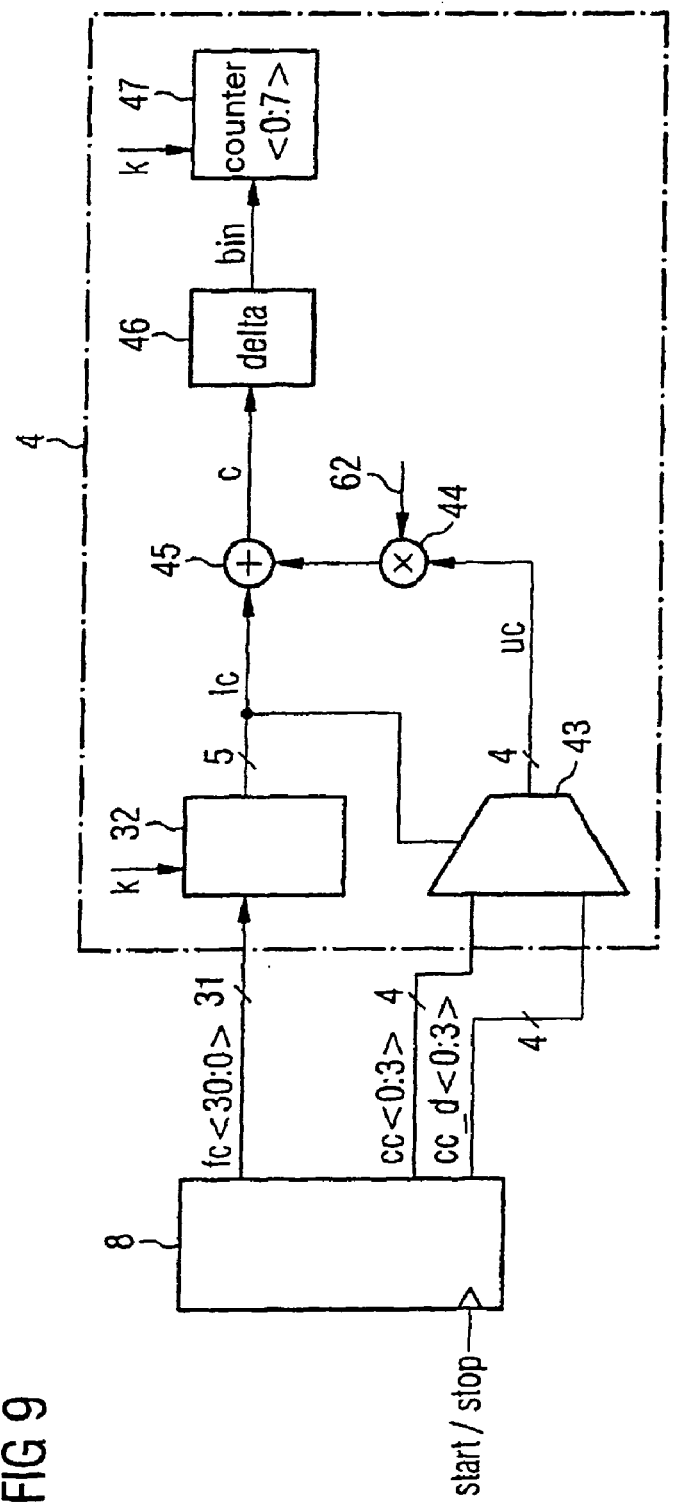
FIG. 9 illustrates an embodiment of an evaluating device used in the electrical circuit.

FIG. 9 illustrates details of the evaluating unit 4 and a time trap block 8. The time trap block 8 contains the control unit 2, the time stamp 3, the time trap elements 5, the number of which is 31 in the present case, and the counter 6.

The time trap block 8 receives the start/stop signal as input signal and outputs the counter signal cc<0:3>, the delayed counter signal cc_d<0:3> and the output signals fc<30:0>. The output signals of the flip flops 10 will also be called finecount signals in the text which follows. The evaluating unit 4 contains a decoder 32, a selection block 43, a multiplier 44, an adder 45, a differentiator 46 and an evaluation counter 47. The decoder 32 receives the finecount signals fc<30:0> and generates the signal lc. This signal lc is compressed with respect to the signals fc<30:0> so that it only needs 4 bits for representing the information.

Depending on the state of the signal lc, the multiplexer 43 either switches the signal cc<0:3> or the signal cc_d<0:3> to its output uc. Representing the 31 possible combinations of the signal fc<30:0>needs 5 bits which also corresponds to the word width of the signal lc. The resolution of the signal lc can be determined via the signal k. As a result, a number of time units δt can be combined. For example, lc only outputs four different values although the resolution of finecount signals is greater.

The signal uc is multiplied by the numerical value 62 by means of the multiplier 44. The result is added to the signal lc in the adder 45. The result of this addition is the signal c which is conducted to the differentiator 46. The differentiator 46 forms the difference of the signals c which have been measured at the points in time T1 and T2. The result of this difference is stored in the evaluation counter 47. The evaluation counter 47 contains eight individual result counters. Each result counter is allocated to a measuring range. If a bin corresponds to such a measuring range, the associated result counter is incremented by one.

The magnitude of the measuring ranges for the counters are adjusted via the control signal k. Fine changes in the magnitude of the measuring ranges increases or reduces the resolution of the measurement. This is used for detecting the distribution of the measurement values as completely as possible but, at the same time, as accurately as possible. In the case of a standard distribution, one or two result counters should be available for a measuring range which is one σ wide. In the case of six σ, twelve result counters are thus needed. In the case of safety-critical measurements, e.g. for components installed in motor cars, a large measuring range can be selected. In contrast, a greater resolution and thus faster measurement will be selected in the case of components for consumer products.

If, for example, 20 counters are available, a total measuring range of 160 bins can be covered if in each case eight bins are combined to form one measuring range each. If it is found that the measured range is too wide and no measurement values were counted in most of the measuring ranges, fewer bins are combined in one measuring range in the subsequent measurements. As a result, the resolution, and thus the reading accuracy, becomes greater. What measuring ranges are combined will preferably be controlled from the outside by software or can be set by a user.

FIG. 10 illustrates the measurement results for the measurement of a time interval by means of the method according to the invention. In this figure, the frequency of the occurrence of the bins is plotted against the bins. The bins are drawn in the finecount unit, five finecount stages causing the counter to increment by one. The frequency rises from the bin eight clock cycles plus four fc up to the bin ten clock cycles whereupon it drops again down to the bin eleven clock cycles plus three fc. From such a frequency, mean values and standard deviations can be calculated.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An electrical circuit for measuring times, wherein the electrical circuit has a counter, a decoder and a multiplicity of time trap elements, wherein at least the counter and the time trap elements are located together on an integrated semiconductor component and each time trap element comprising:
   a data input, a clock input, a delay output and an output port;
   a delay element which outputs a signal change at the data input with a time delay at the delay output;
   a flip flop with a data input, a clock input and an output port, the data inputs, the clock inputs and the output ports of the flip flop and of the time trap element being connected to one another; and
   wherein the time trap elements are connected as ring oscillator, wherein the counter is connected to the output port of a time trap element and the decoder is connected to the output ports of all time trap elements, and wherein the delay element and the flip flop of each time trap element are arranged such that the physical distance between the delay element and the flip flop is less than the largest physical distance between the flip flops of different time trap elements.

2. The electrical circuit as claimed in claim 1, comprising wherein the decoder is connected to the output ports of all of the time trap elements by corresponding signal lines, and wherein the length of the signal lines vary in response to positions of the respective time trap elements.

3. The electrical circuit as claimed in claim 1, comprising wherein the distance between the delay element and the flip flop is less than the largest distance between the flip flops of three adjacent time trap elements.

4. The electrical circuit as claimed in claim 1, comprising wherein the clock inputs of each time trap element are connected to a start/stop generator by respective lines, and wherein the length of each of the lines is about equal.

5. An electrical circuit for measuring times, wherein the electrical circuit has a counter, a decoder and a multiplicity of time trap elements, wherein at least the counter and the time trap elements are located together on an integrated semiconductor component and each time trap element comprises:
   a data input, a clock input, a delay output and an output port;
   a delay element which outputs a signal change at the data input with a time delay at the delay output;
   a flip flop with a data input, a clock input and an output port, the data inputs, the clock inputs and the output ports of the flip flop and of the time trap element being connected to one another; and
   wherein the time trap elements are connected as ring oscillator, wherein the counter is connected to the output port of a time trap element and the decoder is connected to the output ports of all time trap elements, and wherein a correction device corrects the output value of the counter.

6. The electrical circuit as claimed in claim 5, comprising a start/stop generator, an output of which is connected to the clock inputs of the time trap elements via clock lines wherein the clock lines are arranged in such a manner that the delays from the start/stop generator to the flip flops of the time trap elements are essentially identical.

7. The electrical circuit as claimed in claim 6, comprising wherein the supply lines, which supply the time trap elements are connected to other contact pads than the supply lines for other parts of the electrical circuit.

8. The electrical circuit as claimed in claim 5, comprising wherein the supply lines for the voltage supply are arranged in such a manner that the supply lines supplying the time trap elements are separate from the supply lines for other parts of the electrical circuit and in which capacitors are applied to the supply lines for the delay elements.

9. The electrical circuit as claimed in claim 5, comprising wherein a single time trap element outputs at its delay output a signal which corresponds to a delayed inverted signal at the data input, and the other time trap elements are non-inverting at their delay outputs.

10. The electrical circuit as claimed in claim 5, comprising wherein the number of time trap elements is odd-numbered and each time trap element outputs at the delay output a signal which corresponds to a delayed inverted signal at the data input.

11. The electrical circuit as claimed in claim 10, comprising wherein the number of time trap elements is a prime number.

12. The electrical circuit as claimed in claim 5, comprising wherein the output value of the counter is corrected in dependence on a signal which is generated by the delay of the output signal of the counter.

13. The electrical circuit as claimed in claim 5, comprising wherein the output value of the counter is corrected in dependence on an output signal of the time trap elements.

14. The electrical circuit as claimed in claim 13, comprising wherein the correction block has a flip flop which stores the output value of the time trap element.

15. The electrical circuit as claimed in claim 5, comprising wherein the delay of the delay elements is adjustable.

16. The electrical circuit as claimed in claim 15, comprising wherein the delay of the delay elements is adjustable via connectable capacitors.

17. The electrical circuit as claimed in claim 5, in which the delay outputs of the time trap elements are set to a predetermined value by a reset device and the ring oscillator is interrupted.

18. The electrical circuit as claimed in claim 17, comprising wherein the measured time intervals are divided into measuring ranges and in which a result counter, which is incremented when the measured time interval belongs to the measuring range, is provided per measuring range in the evaluating circuit.

19. The electrical circuit as claimed in claim 5, comprising wherein an evaluating circuit measures a time interval between two points in time, wherein the points in time are obtained from the change in the levels of the output signal of the staff/stop generator; and
   wherein the time interval is calculated by comparing output values of the counter and of the decoder at different points in time.

20. The electrical circuit as claimed in claim 5, comprising wherein the width of the measuring range can be adjusted.

21. The electrical circuit as claimed in claim 5, constructed by purely digital components.

22. The electrical circuit as claimed in claim 5, integrated on a semiconductor chip together with another circuit to be tested.

23. A method for measuring time intervals by means of an electrical circuit, the method comprising:
   setting a control variable i to zero, specifying the number k of measurement iterations and specifying the magnitude G of measuring ranges;
   generating two signal changes of a clock signal in the staff/stop generator at two different points in time;
   reading the output values of a decoder and of a first counter at the two points in time and calculating numerical values for the two points in time from the output values;
   forming a difference of the calculated numerical values;
   correlating the difference of the calculated numerical values, with a measuring range and incrementing a result counter belonging to the measuring range;
   incrementing the control variables i; and
   if i is less than or equal to k, continuing with generating two signal changes of a clock signal.

24. The method as claimed in claim 23, in which the output value of the first counter is corrected before forming a difference or the difference formed is corrected before correlating the difference.

25. The method as claimed in claim 23, comprising repeating the method, the control variable i is initialized with zero and the magnitude G of measuring ranges is changed.

26. The method as claimed in claim 23, further comprising: calculating the parameters of a random distribution from the inputs of the result counters and are output.

27. The method of claim 23, farther comprising: defining the electrical circuit to comprise the first counter, the decoder and a multiplicity of time trap elements, wherein at least the first counter and the time trap elements are located together on an integrated semiconductor component and each time trap element comprising:
   a data input, a clock input, a delay output and an output port;
   a delay element which outputs a signal change at the data input with a time delay at the delay output;
   a flip flop with a data input, a clock input and an output port, the data inputs, the clock inputs and the output ports of the flip flop and of the time trap element being connected to one another; and wherein the time trap elements are connected as ring oscillator, wherein the counter is connected to the output port of a time trap element and the decoder is connected to the output ports of all time trap elements, and wherein the delay element and the flip flop of each time trap element are arranged close to one another.

28. The method as claimed in claim 27, further comprising: changing the delay of the delay elements, and repeating the method beginning with generating two signal changes of the clock signal.

29. An electrical circuit for measuring times, wherein the electrical circuit has a counter, a decoder and a multiplicity of time trap elements, wherein at least the counter and the time trap elements are located together on an integrated semiconductor component and each time trap element comprising:

a data input, a clock input, a delay output and an output port;

means for providing a delay element which outputs a signal change at the data input with a time delay at the delay output;

means for providing a flip flop with a data input, a clock input and an output port, the data inputs, the clock inputs and the output ports of the flip flop and of the time trap element being connected to one another; and wherein the time trap elements are connected as ring oscillator, wherein the counter is connected to the output port of a time trap element and the decoder is connected to the output ports of all time trap elements, and wherein the delay element means and the flip flop means of each time trap element are arranged such that the physical distance between the delay element and the flip flop is less than the largest physical distance between the flip flops of different time trap elements.

* * * * *

UNITED STATES PATENT AND TRADEMARK OFFICE
CERTIFICATE OF CORRECTION

| | | |
|---|---|---|
| PATENT NO. | : 7,653,170 B2 | Page 1 of 1 |
| APPLICATION NO. | : 11/440481 | |
| DATED | : January 26, 2010 | |
| INVENTOR(S) | : Heinz Mattes et al. | |

It is certified that error appears in the above-identified patent and that said Letters Patent is hereby corrected as shown below:

Column 16, line 15, claim 19, delete "staff/stop" and insert in place thereof --start/stop--.

Column 16, line 33, claim 23, delete "staff/stop" and insert in place thereof --start/stop--.

Signed and Sealed this

Twentieth Day of April, 2010

David J. Kappos
*Director of the United States Patent and Trademark Office*